United States Patent
Kelkar et al.

(12)
(10) Patent No.: US 6,803,648 B1
(45) Date of Patent: Oct. 12, 2004

(54) INTEGRATED CIRCUIT PACKAGES WITH INTERCONNECTS ON TOP AND BOTTOM SURFACES

(75) Inventors: Nikhil Kelkar, San Jose, CA (US); Neeraj Anil Pendse, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 56 days.

(21) Appl. No.: 10/341,328

(22) Filed: Jan. 10, 2003

(51) Int. Cl.[7] ............................................. H01L 23/495

(52) U.S. Cl. ....................................... 257/676; 257/666

(58) Field of Search ................................ 257/676, 673, 257/672, 666

(56) References Cited

U.S. PATENT DOCUMENTS

| | | | |
|---|---|---|---|
| 5,157,475 A | 10/1992 | Yamaguchi | 257/784 |
| 5,835,988 A | 11/1998 | Ishii | 257/684 |
| 6,459,148 B1 * | 10/2002 | Chun-Jen et al. | 257/692 |
| 6,723,585 B1 * | 4/2004 | Tu et al. | 438/123 |

* cited by examiner

*Primary Examiner*—Phat X. Cao
(74) *Attorney, Agent, or Firm*—Beyer Weaver & Thomas

(57) ABSTRACT

Semiconductor device packages having top and bottom interconnecting surfaces that can be connected to external electrical systems are described. These packages include internal contact leads that are bent such that they extend from a top surface to a bottom surface of the package and thereby form the corresponding interconnecting surfaces. In some embodiments, a solder ball is formed on either the top or bottom portion of the contact leads so that the solder balls form one of the contact surfaces of the package.

16 Claims, 5 Drawing Sheets

INTEGRATED CIRCUIT PACKAGES WITH INTERCONNECTS ON TOP AND BOTTOM SURFACES

CROSS-REFERENCE TO RELATED APPLICATIONS

This application is related to U.S. patent application Ser. No. 09/568,094, entitled "DEVICE AND METHOD FOR PROVIDING A TRUE SEMICONDUCTOR DIE TO EXTERNAL FIBER OPTIC CABLE CONNECTION," filed on May 9, 2000, which is now U.S. Pat. No. 6,364,542, to U.S. patent application Ser. No. 09/568,558, entitled "ARRAYABLE, SCALABLE AND STACKABLE MOLDED PACKAGE CONFIGURATION," filed on May 9, 2000, to U.S. patent application Ser. No. 09/947,210, entitled "Techniques For Joining An Optoelectronic Module To A Semiconductor Package," filed on Aug. 3, 2001, to U.S. patent application Ser. No. 10/006,443, entitled "TECHNIQUES FOR MAINTAINING PARALLELISM BETWEEN OPTICAL AND CHIP SUB ASSEMBLIES," filed on Nov. 19, 2001, to U.S. patent application Ser. No. 09/922,358, entitled "MINIATURE SEMICONDUCTOR PACKAGE FOR OPTOELECTRONIC DEVICES," filed on Aug. 3, 2001, to U.S. patent application Ser. No. 10/165,553, entitled "OPTICAL SUB-ASSEMBLY FOR OPTO-ELECTRONIC MODULES," filed Jun. 5, 2002, to U.S. patent application Ser. No. 10/165,711, entitled "CERAMIC OPTICAL SUB-ASSEMBLY FOR OPTO-ELECTRONIC MODULES," filed on Jun. 6, 2002, the content of each of which are hereby incorporated by reference.

FIELD OF THE INVENTION

The present invention relates generally to semiconductor devices, and more specifically to semiconductor devices that have electrical contacts on opposing external surfaces.

BACKGROUND OF THE INVENTION

Packaged semiconductor devices typically include a semiconductor die that has integrated circuits formed within, a packaging material that encapsulates the die, and electrically conductive contact leads that connect the die to an external electrical system outside of the packaging material. These packaged devices are connected to the external electrical system by mating one surface of a packaged device with a surface of the external electrical system. However, some types of packaged semiconductor devices, such as packaged semiconductor device 100 as shown in FIG. 1, can be connected to two separate electrical systems by placing an electrical system on the top surface 102 and the bottom surface 104 of device 100. FIG. 1 illustrates a perspective view of a present day semiconductor package 100 wherein molding material 114 is made to be see-through.

Packaged semiconductor device 100 includes a semiconductor die 106, electrically conductive contact leads 108, interconnecting wires 110, uplinking contact leads 112, and a protective molding material 114. Semiconductor die 106 has wirebond pads 116 and uplinking pads 118 formed on the top surface of die 106. Wirebond pads 116 provide a proper surface onto which interconnecting wires 110 are wirebonded to die 106 and uplinking pads 118 provide a proper surface onto which uplinking contact leads 112 can be attached. In one embodiment, wirebond pads 116 are formed of aluminum, uplinking pads 118 are formed of copper, and uplinking contact leads 112 are formed of electrically conductive solder.

Interconnecting wires 110 connect die 106 to contact leads 108, which in turn allow the bottom surface 104 of package 100 to be electrically connected to an electrical system. At the same time, uplinking contact leads 112 allow the top surface 102 of package 100 to be connected to another electrical system. In one implementation, bottom surface 104 can be attached to a printed circuit board and top surface 102 can be connected to an optical device such that the combination of the semiconductor device package 100 and the optical device form an optoelectronic module. For further description relating to semiconductor device package 100, see U.S. Pat. No. 6,364,542, entitled "DEVICE AND METHOD FOR PROVIDING A TRUE SEMICONDUCTOR DIE TO EXTERNAL FIBER OPTIC CABLE CONNECTION," which is incorporated herein by reference.

Semiconductor device package 100 is advantageous because it can be connected to multiple electrical systems. Even though packages such as package 100 are providing useful solutions for computing and electrical systems, improvements to package 100 are still desirable. Several aspects of package 100 require improvement to achieve better structural configurations and to allow more efficient manufacturing steps to be used. For instance, the present manufacturing process is a bit expensive, time consuming, and complex since two different process steps are required to form the two types of contact pads 116 and 118 on die 106. Also, the size of uplinking contacts 112 and the required separation between each forces die 106 to have a relatively large top surface. Therefore, uplinking contacts 112, which are typically solder ball formations, force die 106 to have a larger size than what is actually required to contain the integrated circuits.

Also, during the wafer sorting stage (a wafer testing stage), a testing probe having probes at two height levels is required to make contact with uplinking contacts 112 and wirebond pads 116. Then, during the subsequent package testing stage, the manufacturing tolerances with respect to the process of attaching die 106 into the middle of contact leads 108 becomes critical. This is due to the fact that electrical contact for testing purposes must be made with both the uplinking contacts 112 and contact leads 108. The testing probes for the top and bottom leads are typically in fixed alignment with each other, therefore, die 106 must be in correct alignment with electrical contact leads 108 to allow for proper contact between the probes and the contact leads 108 and the uplinking contacts 112.

In view of the foregoing, a smaller semiconductor device that is easier to manufacture and which has contact surfaces on both a top and a bottom external surface would be desirable.

BRIEF SUMMARY OF THE INVENTION

The present invention is directed to semiconductor device packages that have top and bottom interconnecting surfaces that can be connected to external electrical systems. These packages include internal contact leads that are bent such that they extend from a top surface to a bottom surface of the package and thereby form the corresponding interconnecting surfaces. In some embodiments, a solder ball is formed on either the top or bottom portion of the contact leads so that the solder balls form one of the contact surfaces of the package.

As an apparatus, one embodiment of the present invention includes at least a semiconductor die, a molding material that encapsulates the die, the molding material having a top and a bottom surface, a plurality of electrically conductive bent strips, each bent strip having a first bottom portion that is exposed through the bottom surface of the molding material and a top portion that is exposed through the top surface of the molding material, and a plurality of interconnecting wires that each connect one of the bent strips to the die.

Another embodiment of the apparatus includes at least a semiconductor die, a molding material that encapsulates the die, the molding material having a top and a bottom surface, a plurality of electrically conductive bent strips, each bent strip having a first bottom portion that is exposed through the bottom surface of the molding material and a top portion; a plurality of electrically conductive solder balls that are each attached to the top portion of each bent strip, each solder ball being exposed through the top surface of the molding material, and a plurality of interconnecting wires that each connect one of the bent strips to the die.

In yet another embodiment of the apparatus includes at least a semiconductor die, a molding material that encapsulates the die, the molding material having a top and a bottom surface, a plurality of electrically conductive bent strips, each bent strip having a first bottom portion and a top portion that is exposed through the top surface of the molding material, a plurality of electrically conductive solder balls that are each attached to the bottom portion of at least some of the bent strips, each solder ball being exposed through the bottom surface of the molding material, and a plurality of interconnecting wires that each connect one of the bent strips to the die.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which:

FIG. 1 illustrates a perspective view of a present day semiconductor package wherein molding material is made to be see-through.

FIG. 3 illustrates a perspective view of the package of FIGS. 2A and 2B wherein the molding material is also see-through.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to a semiconductor device package that has top and bottom interconnecting surfaces that can be connected to external electrical systems. These packages include internal contact leads that are bent such that they extend from a top surface to a bottom surface of the package and thereby form the corresponding interconnecting surfaces. In some embodiments, a solder ball is formed on either the top or bottom portion of the contact leads so that the solder balls form one of the contact surfaces of the package. The semiconductor device can be used to create modules or sub-assemblies by attaching other electronic components, thus maximizing integration of a printed circuit board. For instance, a bottom surface of the semiconductor device package can be attached to a printed circuit board, while the top surface is attached to another semiconductor device or an optical device. Specifically, the device packages can be useful for creating optoelectronic systems. For further details regarding the various uses of a semiconductor package of the present invention, please refer to U.S. patent application Ser. No. 09/568,558, entitled "ARRAYABLE, SCALABLE AND STACKABLE MOLDED PACKAGE CONFIGURATION," to U.S. patent application Ser. No. 09/568,558, entitled "ARRAYABLE, SCALABLE AND STACKABLE MOLDED PACKAGE CONFIGURATION," filed on May 9, 2000, and to U.S. patent application Ser. No. 10/165,553, entitled "OPTICAL SUB-ASSEMBLY FOR OPTO-ELECTRONIC MODULES," filed Jun. 5, 2002.

Figure 2A:
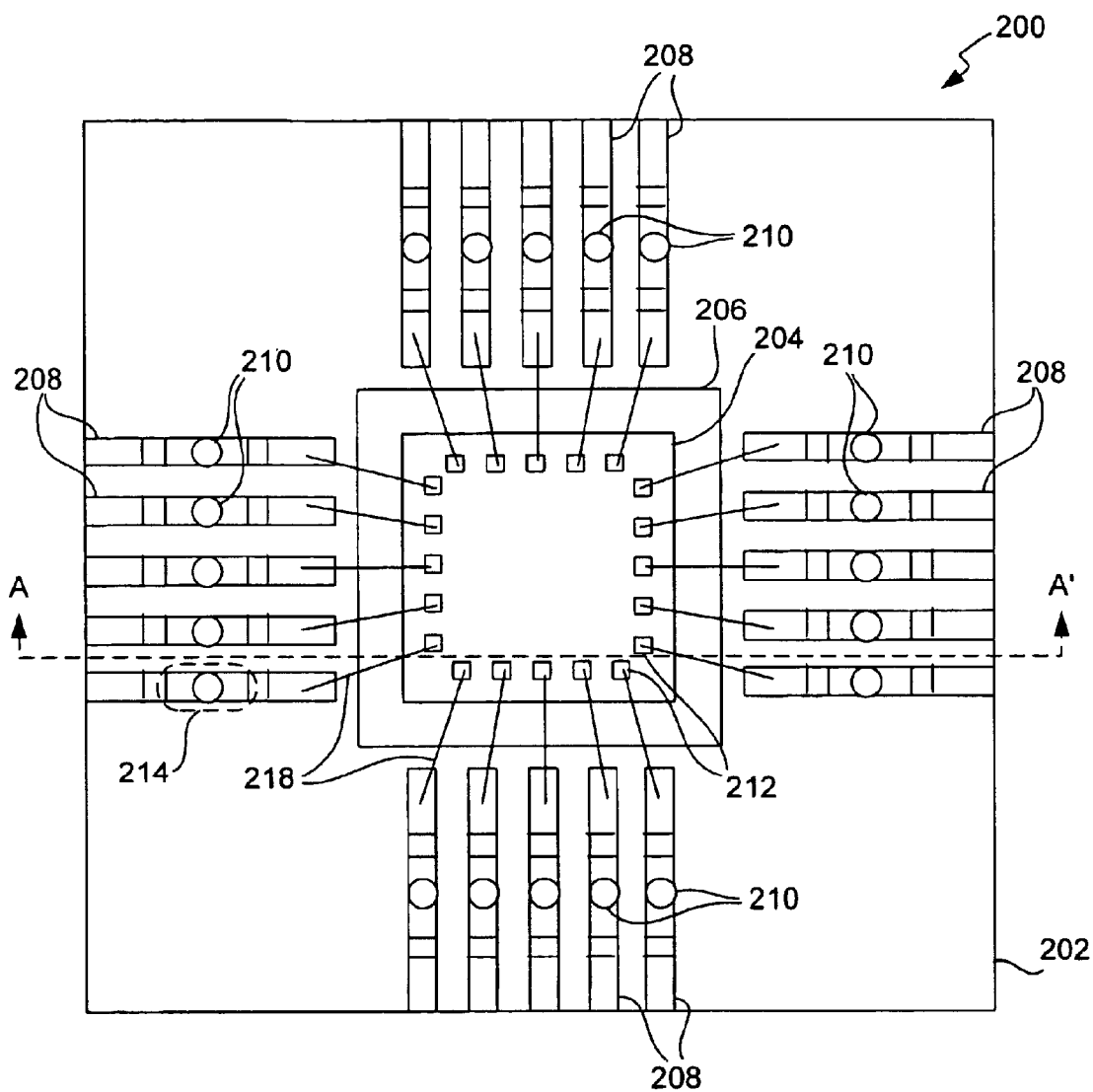
FIG. 2A illustrates a top plan view of a semiconductor device package wherein the molding material is see-through, according to one embodiment of the invention.
Figure 2B:
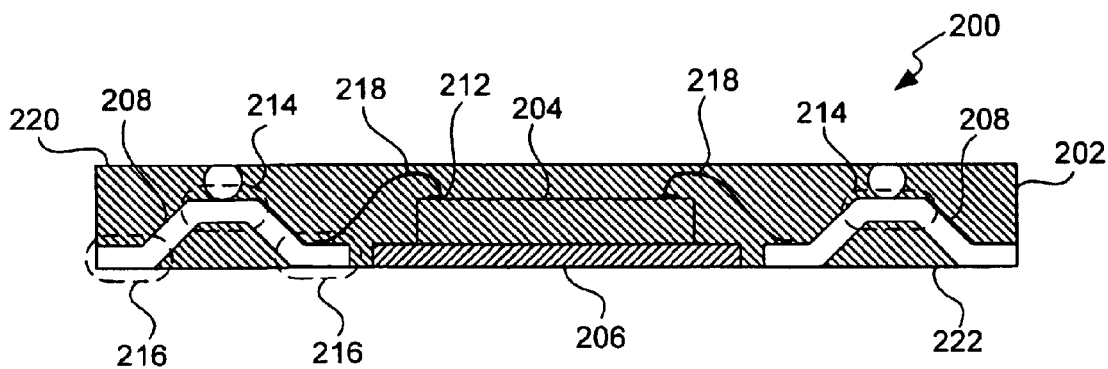
FIG. 2B illustrates a cross-sectional view of the package of FIG. 2A along line A-A'.
Figure 3:
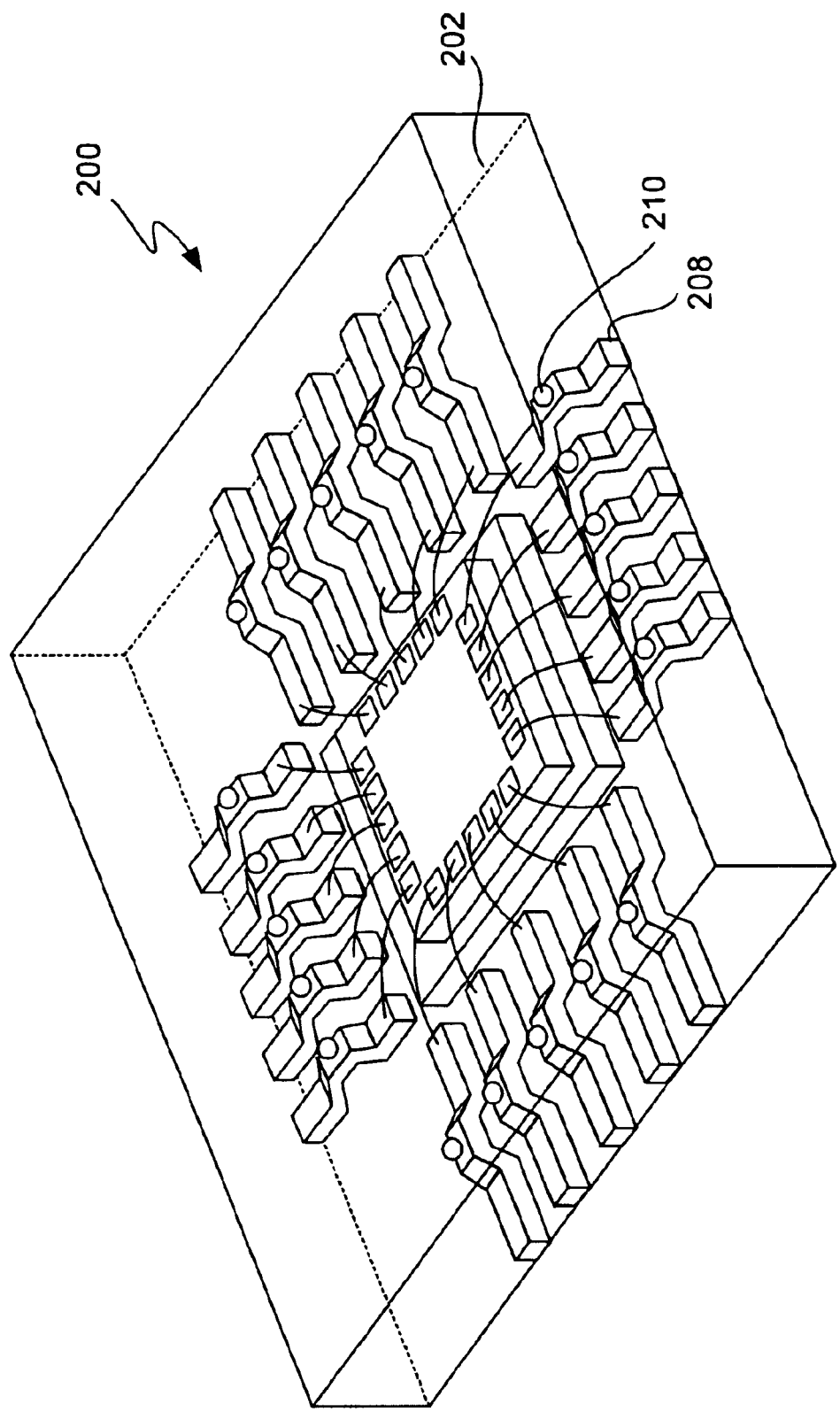

FIGS. 2A, 2B, and 3 illustrate one embodiment of the present invention. FIG. 2A illustrates a top plan view of a semiconductor device package 200 wherein the molding material 202 is see-through. FIG. 2B illustrates a cross-sectional view of package 200 of FIG. 2A along line A-A'. And FIG. 3 illustrates a perspective view of package 200 of FIGS. 2A and 2B wherein the molding material is also see-through.

The following description will focus on FIG. 2A, however, reference to FIGS. 2B and 3 should also be made to better understand the invention. Semiconductor device package 200 includes a semiconductor die 204, which is mounted on top of a die attach pad 206, multiple electrically conductive contact leads 208 and uplinking contacts 210. Semiconductor die 204 contains integrated circuits that are designed for various computational purposes. Wirebond pads 212 are formed on the top surface of die 204. Wirebond pads 212 are metal formations that provide an appropriate surface upon which an interconnecting wire 218 can be wirebonded to the top surface of die 204. Wirebond pads 212 can be formed out of metals such as aluminum. Die attach pad 206 is exposed through the bottom surface of molding material 202. This configuration allows die attach pad 206 to provide a pathway for heat to dissipate from die 204 to the outside of package 200. Typically, die attach pad 206 is an electrically conductive material that is formed from the same material that forms contact leads 208.

Electrically conductive contact leads 208 are strips of material, such as copper, that are bent into the upside-down "U"-shape. The upper portion 214 of contact leads 208, which represents the curved portion of the U, is formed so that it can support an uplinking contact 210. Uplinking contact 210 is typically an electrically conductive formation of solder material. In other words, uplinking contact 210 can be a solder ball. The upper portion 214 of contact leads 208 has a flat top surface that supports uplinking contact 210. However, it is not necessary that upper portion 214 have a completely flat top surface. The size of the upper portion 214 should be large enough for an uplinking contact 210 to be formed thereon. The two lower portions 216 of contact leads 208, which represent the ends of the U-shape, are manufactured to be exposed through the bottom surface of molding material 202. The size of the lower portions 216 and the amount they are exposed through molding material 202 depends upon how large of a contact surface is required in order for package 200 to make contact with external electrical systems.

In alternative embodiments, uplinking contacts 210 need not be formed on each and every contact lead 208. For example, in some implementations of package 200, the number interconnecting surfaces on the top surface 220 need not equal the number of interconnecting surfaces on the bottom surface 222 of package 200.

The angle of bend for each of contact leads 208 should be such that after placing uplinking contact 210 on upper portion 214, uplinking contact 210 will be exposed through the top surface of molding material 202. The configuration of contact leads 208 takes into consideration that uplinking contacts 210 may become slightly deformed by a molding cavity during some manufacturing processes. The angle of bend for contact leads 208 should not be so large that the integrity of the contact leads 208 is compromised. For example, at excessive angles, the metal forming contact leads 208 can lose strength and structurally fail (e.g., the leads can snap).

In alternative embodiments, contact leads 208 have only one lower portion 216. As seen in FIGS. 2A, 2B and 3, two lower portions 216 are exposed through the bottom surface of molding material 202. However, in these alternative embodiments, only one lower portion may be required to show through the bottom surface. In these embodiments, contact leads 208 can have an S-shape. This s-shape would be formed from the lower portion 216 that is closer to die 204 and upper portions 214, with the lower portion 216 on the outer edges of package 200 being left off.

Electrically conductive interconnecting wires 218 connect die 204 to contact leads 208. Wires 218 are bonded to wirebond pads 212 and to the lower portions 216 of contact leads 208. Note that interconnecting wires 218 are bonded to the surface of the lower portions 216 that is opposite to the surface that is exposed through bottom surface 222. Typically, wires 218 are ball-bonded to wirebond pads 212 and stitch bonded to lower portions 216. However, in some embodiments, the types of bonds on each of the wirebond pads 212 and contact leads 208 can be reversed.

One technique for manufacturing package 200 starts with a solid sheet of conductive material, e.g., a sheet of metal. Then the components of die attach pads and contact leads can be stamped out of the sheet metal or etched out. Typically, a single sheet of metal can be stamped or etched to contain multiple rows and columns of semiconductor device areas, each containing a pattern of a die attach pad and surrounding contact leads as shown in FIG. 2A. After this initial stamp or etching process the contact leads maintain the flat contour that the metal sheet had. Then in a subsequent process, a machine can be used to bend some or all of the contact leads surround the die attach pads to have an upper portion and one or more lower portions as discussed above. Alternatively, if a stamping process is used to create the patterns within the metal substrate, the stamping process can simultaneously create the patterns and bend the contact leads to have a desired shape.

After the metal sheet is patterned, a die attach process is used to attached semiconductor dice onto each of the die attach pads. Then the dice are wirebonded to the surrounding contact leads, a molding process is used to encapsulate the components within a protective molding material, and then a saw blade is used to cut the molded sheet into individual semiconductor device packages. Note that the above description of the manufacturing process is a highly summarized explanation of the manufacturing process and detailed process steps may have been overlooked in an effort to provide a quick and easily understandable description of the manufacturing process. It is also noted that similar manufacturing processes can be used to manufacture the semiconductor packages described throughout this disclosure.

Package 200 has interconnecting surfaces on both the top 220 and bottom 222 surfaces of molding material 202. Once again, these interconnecting surfaces include uplinking contacts 210 on top surface 220 and lower portions 216 of contact leads 208 on bottom surface 222. These interconnecting surfaces advantageously allow two sides of package 200 to be conveniently connect to multiple electrical systems. Also, the design of package 200 involves forming only wirebond pads 212 and wirebonds on top of die 204. In other words, solder balls and solder pads are not required to be formed on die 204 in addition to the wirebond pads 212. This allows die 204 to have relatively smaller dimensions.

Package 200 also allows for easier testing during both the wafer testing and package testing stages. Testing wafers that only have wirebond pads 212 is relatively simple because a testing device having uniform height test probes can be used. This is opposed to the situation that requires a bi-level testing device for wirebond pads and uplinking contacts, which have different heights. Also, during package testing, alignment between probes for testing the uplinking contacts 210 on the upper surface 220 of package 200 and the lower portions 216 on the bottom surface 222 of package 200 is easily maintained since both the upper and lower interconnecting surfaces are provided by a single contact lead. This simplifies the package level testing process.

Figure 4A:
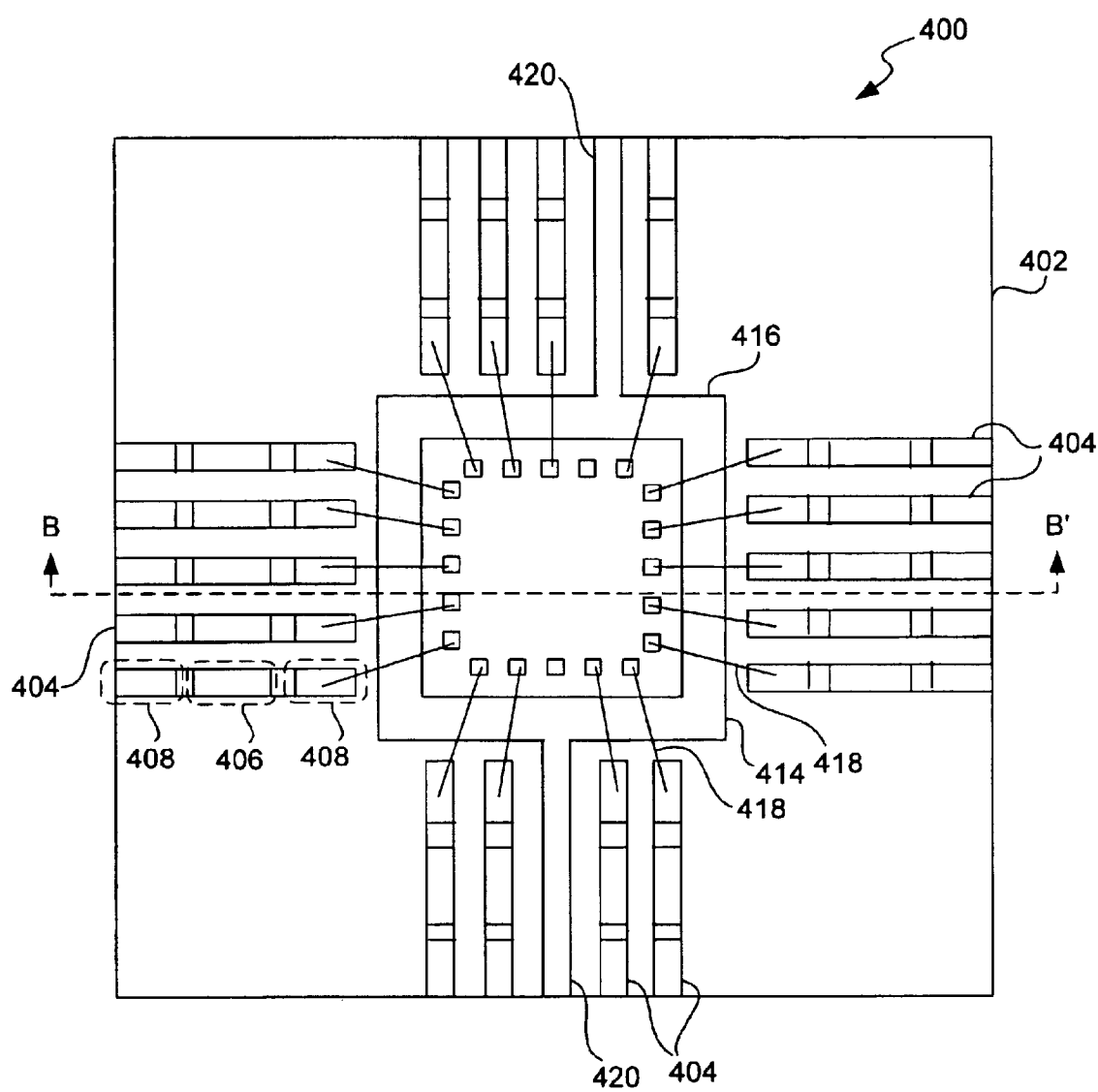
FIGS. 4A and 4B illustrate an alternative embodiment of the present invention in which uplinking contacts are not used.
Figure 4B:
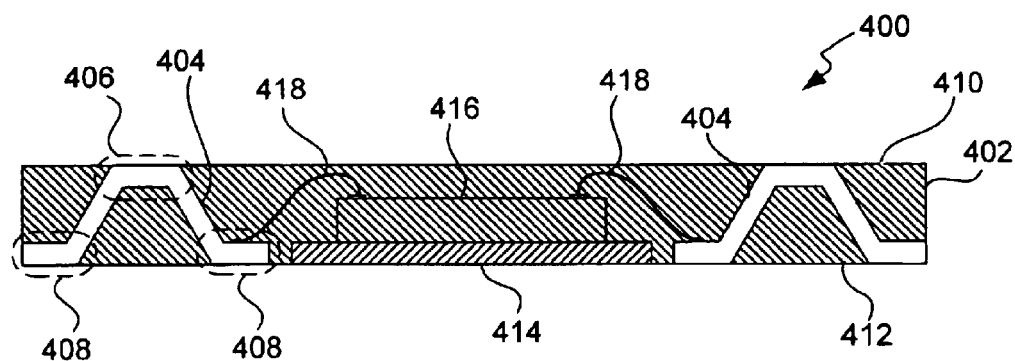

FIGS. 4A and 4B illustrate an alternative embodiment of the present invention in which uplinking contacts are not used. FIG. 4A illustrates a top plan view of a semiconductor package 400 wherein molding material 402 is see-through. FIG. 4B illustrates a cross-sectional view of package 400 along line B-B'. Semiconductor package 400 is similar to package 200 of FIGS. 2A, 2B, and 3, however, one difference is that package 400 does not have a uplinking contacts formed on conductive leads 404. Instead, upper portions 406 of each of contact leads 404 are exposed through the top surface 410 of package 400. Also, lower portions 408 of the contact leads 404 are exposed through the bottom surface 412 of package 400.

To form package 400, contact leads 404 can be bent at large angles so that upper portions 406 reach top surface 410 of package 400 more quickly. Alternatively, the length of contact leads 404 between upper portions 406 and lower portions 408 can be increased. Another technique to form package 400 involves forming molding material to be less thick so that the height of contact leads 404 can be exposed through top surface 410 of package 400. Of course, this technique assumes that the resulting thickness of molding material 402 is still sufficient to encapsulate each of die attach pad 414, die 416, and interconnecting wires 418.

Straight contact leads 420 extend from die attach pad 414 and reach to the peripheral edge of package 200. Straight contact leads 420 are straight in that they are not bent to reach from the bottom surface 412 to the top surface of 410 of package 400. Straight contact leads 420 can serve as electrical ground contacts for semiconductor die 416 and also as additional heat dispersion pathways. In alternative embodiments, straight contact leads 420 need not be integrally formed with die attach pad 414. The alternative embodiments can be designed so that straight contact leads 420 are separately formed from die attach pad 414 and connected to die attach pads 414 with interconnecting wires 418. Straight contact leads 420 can also serve as contact leads that connect die 416 to only the bottom surface 412 of package 400. The number of straight contact leads 420 versus the number of bent contact leads 404 can vary depending upon the input/output and electrical connectivity requirements of the semiconductor device package 400.

Alternative embodiments of package 400 can be formed so that contact leads 404 are shorter and have an S-shape rather than a U-shape as shown. In a similar manner as described for package 200 in FIGS. 2A–3, this shape would involve eliminating the portion of contact leads extending from beyond upper portion 406 to the lower portion 408 at the peripheral edge of package 400.

Manufacture of package 400 can be facilitated in various manners. One technique is to use a relatively thin semiconductor die 416 so that contact leads 404 would be required to rise a smaller distance from bottom surface 412 to top surface 410 through molding material 402. A structural design advantage is that each of contact leads 410 can be bent at a smaller angle, which puts less stress on contact leads 410. In some embodiments, a die thickness of approximately 6 mils or less can be used. An alternative design technique is to have the contact leads extend a longer distance between the upper portions and lower portions so to allow the contact leads to reach top surface of package. This design would require less of a bending angle for each of the contact leads.

Figure 5:
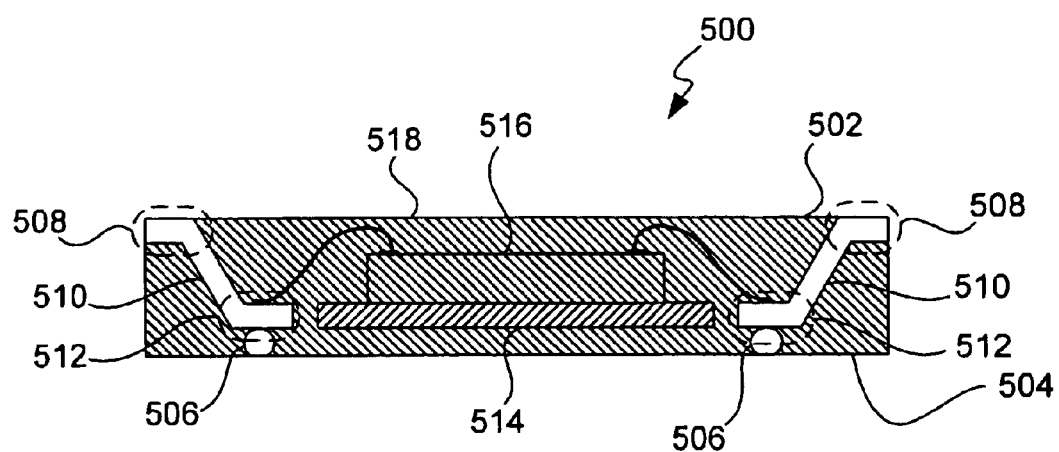
FIG. 5 illustrates a cross-sectional view of a packaged semiconductor device according to another alternative embodiment of the present invention.

FIG. 5 illustrates a cross-sectional view of a packaged semiconductor device 500 according to another alternative embodiment of the present invention. Semiconductor device 500 is different in that an uplinking contact is not formed on an upper surface 508 of contact leads 510, but a linking contact 506 is actually attached to the lower portion 512 of each contact lead 510. Linking contact 506 can be referred to as a "down-linking" contact, however, such a specific name will not be designated since package 500 can easily be flipped upside-down thereby making any naming convention relative to one person's perspective. Therefore, linking contact 506 in FIGS. 4A and 4B will be referred to as simply "linking contact" 506.

Contact leads 510 are S-shaped and the top portions 508 of each lead 510 reach to and are exposed through top surface 502 of packaged device 500. As in the other embodiments, not every contact lead 510 is required to have a linking contact 506 formed on its lower portion 512.

In alternative embodiments, leads 510 could be larger and have the shape of a U where an additional lower portion could extend from upper portion 508 and be exposed through bottom surface 504 of package 500. The additional lower portion and lower portion 506 would form the stems of the U while upper portion 508 forms the curved portion of the U. In yet another alternative embodiment, some of contact leads 510 can be integrally formed with die attach pad 514. These contact leads 510 would not be connected to a wirebond pad of die 516 because they leads 510 would serve as ground leads.

Note that in FIG. 5, die attach pad 514 is completely encapsulated within molding material 518 just as semiconductor die 516 is completely encapsulated.

Figure 1:
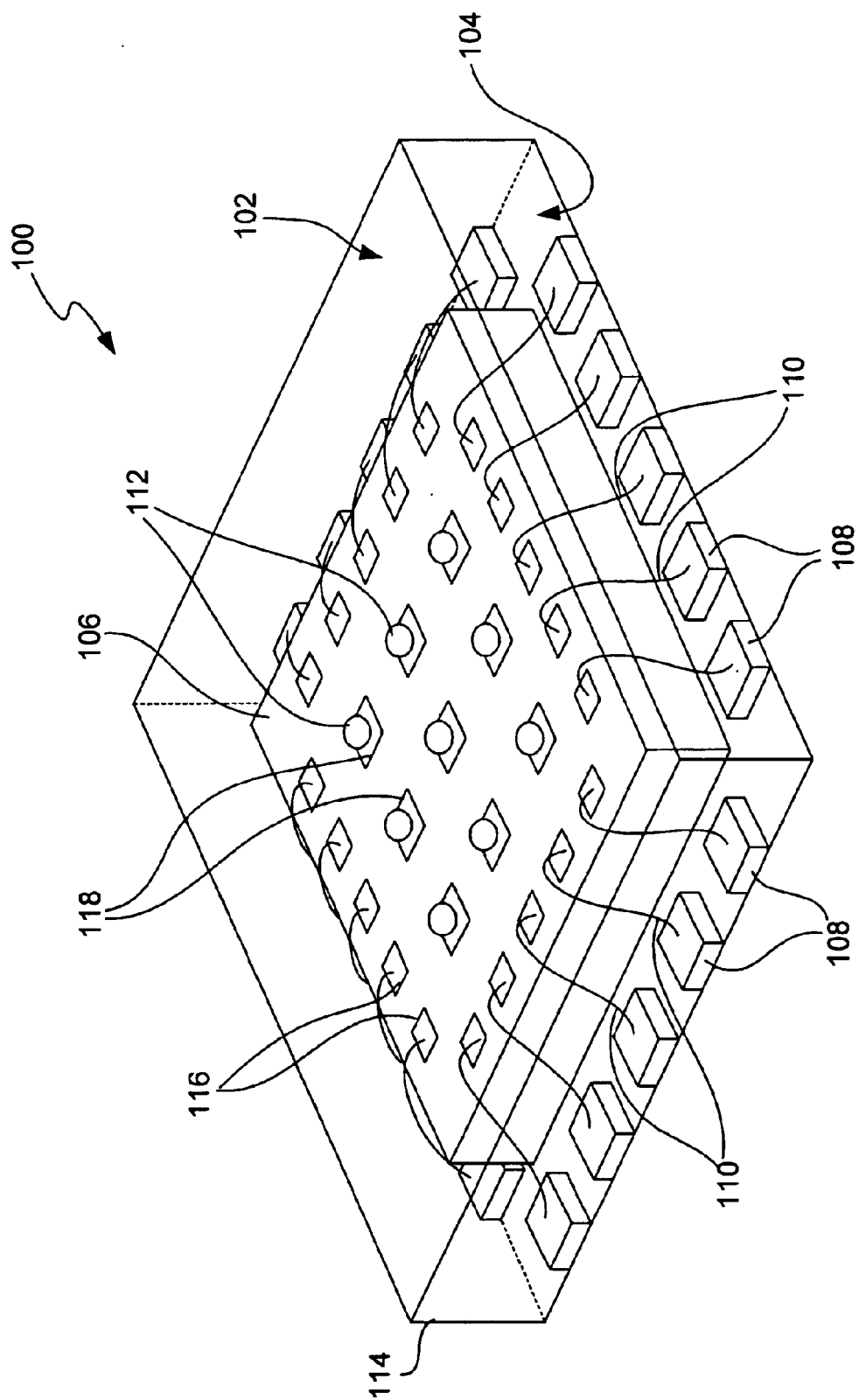

In yet another embodiment of this invention, conventional leads (FIG. 1, 108) and S-shaped or U-shaped (510, 508) leads connecting to two sides of the package can be combined on the same device.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A semiconductor device package comprising:
    a semiconductor die;
    a molding material that encapsulates the die, the molding material having a top and a bottom surface;
    a plurality of electrically conductive bent strips, each bent strip having a first bottom portion that is exposed through a bottom surface of the molding material and a top portion;
    a plurality of electrically conductive solder balls that are each attached to the top portion of each bent strip, each solder ball being exposed through the top surface of the molding material; and
    a plurality of interconnecting wires that each connect one of the bent strips to the die.

2. A semiconductor device package as recited in claim 1 wherein each of the bent strips has a second bottom portion that is also exposed through the bottom surface of the molding material, each of the bent strips having approximately an upside-down U-shape wherein the top portion of each bent strip forms the curved portion of the U and the first and second bottom portions form the ends of the respective stems of the U.

3. A semiconductor device package as recited in claim 1 further comprising:
    a plurality of straight strips that are exposed through the bottom surface of the molding material, and wherein some of the interconnecting wires also connect the die to each of the straight strips.

4. A semiconductor device package as recited in claim 1 wherein a top surface of each solder ball is flat and flush with the top surface of the molding material.

5. A semiconductor device package as recited in claim 1 further comprising:
    a die attach pad upon which the semiconductor die is mounted.

6. A semiconductor device package as recited in claim 5 further comprising:
    a ground lead that is integrally formed with the die attach pad and which extends from the die attach pad and is proximate to one of the bent strips, the ground lead being exposed through the bottom surface of the molding material.

7. A semiconductor device package as recited in claim 5 wherein the die attach pad is exposed through the bottom surface of the molding material.

8. A semiconductor device package comprising:
    a semiconductor die;
    a molding material that encapsulates the die, the molding material having a top and a bottom surface;

a plurality of electrically conductive bent strips, and each bent strip having a first bottom portion and a top portion that is exposed through the top surface of the molding material;

a plurality of electrically conductive solder balls that are each attached to the bottom portion of at least some of the bent strips, each solder being exposed through the bottom surface of the molding material; and a plurality of interconnecting wires that each connect one of the bent strips to the die.

9. A semiconductor device package as recited in claim 8 wherein a bottom surface of each solder ball is flat and flush with the bottom surface of the molding material.

10. A semiconductor device package as recited in claim 8 further comprising:

a die attach pad upon which the semiconductor die is mounted.

11. A semiconductor device package comprising:

a semiconductor die;

a molding material that encapsulates the die, the molding material having a first and a second surface;

a plurality of electrically conductive bent strips, each bent strip having a first portion and a second portion that is exposed through the second surface of the molding material;

a plurality of electrically conductive solder balls that are each attached to the first portion of each bent strip, each solder ball being exposed through the first surface of the molding material; and a plurality of interconnecting wires that each connect one of the bent strips to the die.

12. A semiconductor device package as recited in claim 11 wherein the first and second surface of the molding material are a top and a bottom surface of the molding material, respectively, and the first and second portion of each strip are a top and a bottom portion of each bent strip, respectively.

13. A semiconductor device package as recited in claim 12 wherein each of the bent strips has a third portion that is also exposed through the bottom surface of the molding material, each of the bent strips having approximately an upside-down U-shape wherein the first portion of each bent strip forms the curved portion of the U and the second and third portions form the ends of the respective stems of the U.

14. A semiconductor device package as recited in claim 12 wherein a top surface of each solder ball is flat and flush with the top surface of the molding material.

15. A semiconductor device package as recited in claim 11 wherein the first and second surface of the molding material are a bottom and a top surface of the molding material, respectively, and the first and second portion of each bent strip are a bottom and a top portion of each bent strip, respectively.

16. A semiconductor device package as recited in claim 15 wherein a bottom surface of each solder ball is flat and flush with the bottom surface of the molding material.

* * * * *

UNITED STATES PATENT AND TRADEMARK OFFICE
CERTIFICATE OF CORRECTION

PATENT NO. : 6,803,648 B1
DATED : October 12, 2004
INVENTOR(S) : Kelkar et al.

It is certified that error appears in the above-identified patent and that said Letters Patent is hereby corrected as shown below:

Column 8,
Line 24, change "through a bottom" to -- through the bottom --.

Column 9,
Line 1, change "strips, and each" to -- strips, each --.
Line 7, change "solder being" to -- solder ball being --.

Column 10,
Line 6, change "each strip" to -- each bent strip --.

Signed and Sealed this

Fifteenth Day of February, 2005

JON W. DUDAS
*Director of the United States Patent and Trademark Office*